US008211729B2

(12) United States Patent
Dupre et al.

(10) Patent No.: US 8,211,729 B2
(45) Date of Patent: Jul. 3, 2012

(54) METHOD FOR RELEASING THE SUSPENDED STRUCTURE OF A NEMS AND/OR NEMS COMPONENT

(75) Inventors: Cecilia Dupre, Bonsecours (FR); Philippe Robert, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 69 days.

(21) Appl. No.: 12/793,156

(22) Filed: Jun. 3, 2010

(65) Prior Publication Data

US 2010/0317137 A1 Dec. 16, 2010

(30) Foreign Application Priority Data

Jun. 15, 2009 (FR) ..................................... 09 53976

(51) Int. Cl.
*H01L 21/302* (2006.01)
(52) U.S. Cl. .................... 438/50; 438/52; 257/E21.214; 257/E21.613
(58) Field of Classification Search .................... 438/50, 438/52; 257/E21.214, E21.613
See application file for complete search history.

(56) References Cited

U.S. PATENT DOCUMENTS

| 5,329,152 | A  | * | 7/1994  | Janai et al. .................... 257/529 |
| 6,611,033 | B2 | * | 8/2003  | Hsu et al. ...................... 257/414 |
| 2004/0209435 | A1 |   | 10/2004 | Partridge et al. |
| 2004/0248344 | A1 | * | 12/2004 | Partridge et al. ............ 438/127 |
| 2005/0271324 | A1 |   | 12/2005 | Nielson et al. |
| 2006/0148133 | A1 |   | 7/2006  | Nunan et al. |
| 2007/0072327 | A1 |   | 3/2007  | Weigold |
| 2007/0298534 | A1 | * | 12/2007 | Ikushima et al. ............... 438/57 |
| 2009/0085119 | A1 |   | 4/2009  | Ernst et al. |

FOREIGN PATENT DOCUMENTS

EP    2 043 141 A2    4/2009

OTHER PUBLICATIONS

Daniel Grogg, et al., "Multi-Gate Vibrating-Body Field Effect Transistor (VB-FETs)", IEEE International Electron Devices Meeting IEDM, 2008, 4 pages.
A. Hubert, et al., "Oxidation of Suspended Stacked Silicon Nanowires for Sub-10nm Cross-Section Shape Optimization", ECS Transactions, vol. 13, No. 1, 2008, p. 195.
Jae-Joon Choi, et al., "Silicon Angular Resonance Gyroscope by Deep Icprie and $X_eF_2$ Gas Etching", Micro Electro Mechanical Systems, MEMS 98, 1998, pp. 322-327.

(Continued)

*Primary Examiner* — Alexander Ghyka
*Assistant Examiner* — Stanetta Isaac
(74) *Attorney, Agent, or Firm* — Oblon, Spivak, McClelland, Maier & Neustadt, L.L.P.

(57) ABSTRACT

A method for making a microelectronic device comprising at least one electromechanical component provided with a mobile structure,
  the method comprising the steps of:
    forming in at least one fine semiconducting thin layer lying on a supporting layer, at least one bar bound to a block, said bar being intended to form a mobile structure of an electromechanical component,
    withdrawing a portion of the supporting layer under said bar,
    forming at least one passivation layer based on dielectric material around said bar,
    forming an encapsulation layer around the bar and covering said passivation layer,
  the method further comprising steps of:
    making metal contact and/or interconnection areas, and then
    suppressing the encapsulation layer around said bar.

11 Claims, 8 Drawing Sheets

OTHER PUBLICATIONS

T. Ernst, et al., "Novel Si-Based Nanowire Devices: Will they Serve Ultimate MOSFETs Scaling or Ultimate Hybrid Integration?", IEEE International Electron Devices Meeting IEDM, 2008, 4 pages.

Rongrui HE, et al., "Giant Piezoresistance Effect in Silicon Nanowires", Nature Nanotechnology, vol. 1, Oct. 2006, pp. 42-46.

Charles W. Holzwarth, et al., "Localized Substrate Removal Technique Enabling Strong-Confinement Microphotonics in Bulk Si CMOS Processes", IEEE, CLEO/QELS 2008, 2008, 2 pages.

E. Ollier, et al., "NEMS Based on Top-Down Technologies: from Stand-Alone NEMS to VLSI NEMS & NEMS-CMOS Integration", IEEE International Conference on Electron Devices and Solid-State Circuits, EDSSC 2008, 2008, 6 pages.

Siavash Pourkamali, et al., "Low-Impedance VHF and UHF Capacitive Silicon Bulk Acoustic-Wave Resonators—Part II: Measurement and Characterization", IEEE Transactions on Electron Devices, vol. 54, No. 8, Aug. 2007, pp. 2024-2030.

K. Reck, et al., "Piezoresistive Effect in Top-Down Fabricated Silicon Nonowires", IEEE, MEMS 2008, 2008, 4 pages.

Preliminary Search Report issued Feb. 8, 2010 in France Patent Application No. FA726054.

* cited by examiner

METHOD FOR RELEASING THE SUSPENDED STRUCTURE OF A NEMS AND/OR NEMS COMPONENT

TECHNICAL FIELD

The present invention relates to the field of microelectronics and notably to that of devices provided with at least one electromechanical component such as an NEMS (Nano-ElectroMechanical System) and/or an NEMS (Micro-ElectroMechanical Systems).

It provides an improved method for releasing a suspended structure of an electromechanical component and with it a detection suspended structure, possibly mobile, may be made, and which is surrounded by a passivation layer during its final release.

The invention applies to the making of a microelectronic device provided with at least one electromechanical component and with one or more transistors.

PRIOR ART

The intention of co-integrating a NEMS and/or MEMS structure with one or more transistors on a same substrate is known.

There exist several co-integration possibilities.

A first possibility consists of making an NEMS component and a MOS transistor separately.

A second possibility consists of making a component provided with both an NEMS mobile structure and which may fulfill the function of a transistor.

This second possibility is for example described in the document: "*Vibrating-Body Field Effect Transistor (VB-FETs)*", Grogg et al., IEEE International Electron Devices Meeting IEDM, p. 663, 2008.

Making a microelectronic device provided with a NEMS and/or MEMS component, provided with a mobile semiconducting structure in the form of a semiconducting bar, poses a problem, notably during achieving passivation of this semiconducting bar, and when a release of the latter is carried out.

It may be sought to retain a dielectric material thickness around the mobile structure of a NEMS component, in order to form a temporary protective layer during the making of the component, and/or to form a definitive passivation layer, or possibly form a passivation layer playing the role of a gate oxide.

With a passivation layer, it is notably possible to ensure resistance stability of the semiconducting bar.

It is difficult to retain a layer or dielectric material such as $SiO_2$ around the semiconducting bar intended to form the mobile structure of an electromechanical component, after the step for releasing the latter. This semiconducting bar is actually generally released by etching a sacrificial dielectric material layer on which lies this semiconducting bar, and which may also be based on $SiO_2$.

Subsequent making of the dielectric material layer after the release step also poses a problem, in particular when this release step is carried out at the end of the so-called <<back-end>> steps.

In order to make a dielectric thickness around a semiconducting bar by oxidation of the latter, a significant heat budget is actually required, which would be incompatible with the presence of metal contacts and metal interconnections formed during the back-end steps.

When a microelectronic device is made provided with an NEMS or MEMS electromechanical component, co-integrated with a transistor, the release of the mobile structure of the electromechanical component of the semiconducting bar is generally achieved during the <<back-end>> steps, once the interconnection levels have been made.

This release may tend to degrade at the same time the isolating layers in which the metal interconnection levels are formed.

The problem is posed of finding a novel method for releasing the mobile structure of a MEMS or NEMS electromechanical component, which does not include the drawbacks mentioned above.

DISCUSSION OF THE INVENTION

Thus, a method for making a microelectronic device is proposed, comprising at least one electromechanical or electronic component provided with a suspended structure, the method comprising the steps of:

a) forming on a supporting layer (101), at least one element (104) bound to at least one anchoring block (102*b*, 102*d*), said element being intended to form said suspended structure (102*c*) of the electromechanical or electronic component, b) withdrawing a portion of the supporting layer (101) at least under said element, so as to release the suspended structure (104), c) forming a passivation layer (107) around said element, d) forming an encapsulation layer (110) covering said passivation layer and said element, the method further comprising after step d), steps for:

making contact and/or interconnection conducting areas (141, 142, 143, 150$_1$, ..., 150$_p$), and then suppressing the encapsulation layer (110) around said element (104) in order to again release said suspended structure.

A method for making a microelectronic device is also proposed, comprising at least one electromechanical or electronic component provided with a suspended structure, the method comprising the steps of:

a) forming on a supporting layer, at least one element bound to at least one anchoring block in at least one thin layer positioned on the supporting layer, said element being intended to form said suspended structure of the electromechanical or electronic component, b) withdrawing a portion of the supporting layer at least under said element, so as to release the suspended structure, c) forming a passivation layer around said element, d) forming an encapsulation layer covering said passivation layer and said element, the encapsulation layer being based on a material capable of being selectively etched with regard to the material of the passivation layer, the passivation and encapsulation layers being formed so as to cover the thin layer, and the method further comprising, after step d), steps for:

withdrawing portions of the encapsulation layer, so as to reveal a given area of said thin layer, forming a protective layer of the encapsulation layer, partially withdrawing the protective layer and the passivation layer so as to reveal at least said given area of said thin layer, forming at least one transistor from said given area of said thin layer, making contact and/or interconnection conducting areas, and then suppressing the encapsulation layer around said element selectively with regard to the passivation layer, again releasing said suspended structure.

The element intended to form said suspended structure may for example be in the form of a bar, or a wire, or a beam, or of several bars, or several wires, or several beams, for example forming a comb pattern.

The suspended structure may be a detection structure.

The suspended structure may for example be a detection structure, the conductance of which is measured, such as a suspended transistor structure.

In the case when the component is an MEMS and/or NEMS electromechanical component, the suspended structure may be mobile and intended to move.

The suspended structure may for example be a vibrating structure of a resonator.

The composition of said element may depend on the targeted application and may be semiconducting, for example based on Si or SiGe.

The encapsulation layer and the supporting layer are based on different materials.

The encapsulation layer and the passivation layer are also based on different materials.

The encapsulation layer may be based on a material capable of being selectively etched with regard to the dielectric material of the passivation layer.

A release of the mobile structure may thus be performed in two phases, and a passivation layer made prior to the making of contacts and interconnections of the components of the microelectronic device may be protected.

The passivation layer may be formed by oxidation of said element when the latter is based on a semiconductor.

According to an alternative, the passivation layer may be formed by deposition.

According to an embodiment possibility, the encapsulation layer is based on polysilicon or amorphous silicon or SiGe or Si.

According to an embodiment possibility, the passivation layer is based on $SiO_2$ or $Si_xN_y$.

According to an embodiment possibility, step a) may comprise the making of said element, for example in the form of at least one bar and of its anchoring blocks in at least one thin layer positioned on the support.

The method may further comprise, after step d) and prior to the making of the contact and/or interconnection conducting areas, the formation of at least one transistor from a given area of said thin layer.

The passivation and encapsulation layers may be formed so as to cover the thin layer.

In this case, the method may further comprise, prior to forming said transistor, the steps of:
withdrawing portions of the encapsulation layer, so as to reveal said given area of said thin layer,
forming a protective layer of the encapsulation layer,
partially withdrawing the protective layer and the passivation layer so as to reveal at least said given area of said thin layer.

The withdrawal of portions of the encapsulation layer may comprise the formation of one or more apertures respectively above one or more anchoring blocks of said element, said withdrawal of the protective layer and of the passivation layer being carried out so as to reveal said anchoring blocks, the method further comprising the formation of contacts on said anchoring blocks.

Upon forming contacts on said anchoring blocks, a plurality of contacts of the transistor may be achieved.

According to one possibility, said thin layer and the supporting layer may be layers of a semiconductor-on-insulator substrate such as an SOI substrate, the thin layer being semiconducting and the supporting layer being insulating.

The making of conducting areas comprises the formation of a stack of one or more metal levels for interconnecting components of the microelectronic device and of one or more insulating layers, said stack covering said electromechanical component, the method further comprising:
the formation of a hole in said stack facing the elements and revealing the encapsulation layer,
said suppression of the encapsulation layer around said element being achieved by etching the encapsulation layer through said hole.

The suppression of the encapsulation layer around said element may be achieved by etching with $XeF_2$.

SHORT DESCRIPTION OF THE DRAWINGS

The present invention will be better understood upon reading the description of given exemplary embodiments, purely as an indication and by no means as a limitation, with reference to the appended drawings wherein.

Identical, similar or equivalent portions of the different figures bear the same numerical references so as to facilitate passing from one figure to the other.

The different portions illustrated on the figures are not necessarily illustrated according to a uniform scale, in order to make the figures more legible.

DETAILED DISCUSSION OF PARTICULAR EMBODIMENTS

An exemplary embodiment of a microelectronic device will now be described in connection with FIGS. 1A-1G.

The starting material of the method may be a substrate of the semiconductor-on-insulator type, for example of the SOI (Silicon-On-Insulator) type, comprising a first semiconducting layer 100, an insulating layer 101 for example of buried oxide, a thin semiconducting layer 102 lying over the buried oxide layer.

In the semiconducting thin layer 102, patterns 102a, 102b, 102c, 102d, 102e are formed, for example by etching such as dry plasma etching.

Figure 1A:
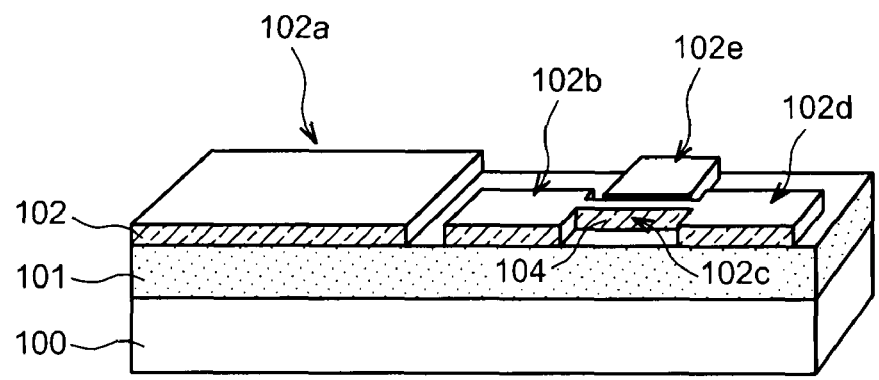
FIGS. 1A-1G illustrate an exemplary method for making a microelectronic device provided with a component including a mobile and/or detection semiconducting suspended structure, surrounded by a passivation layer.

Among the formed patterns 102a, 102b, 102c, 102d, 102e, at least one active area pattern 102a of a transistor may be defined, while patterns of electrodes 102b, 102c, 102d, of a MEMS or NEMS component and at least one pattern 102c intended to form a detection and/or mobile suspended structure of this component are made (FIG. 1A).

The pattern 102c of said structure in this example is in the form of a semiconducting bar 104 with a critical size of the order of one nanometer or of several tens of nanometers in the case of a NEMS component or of a critical size of the order of one micrometer or of several tens of micrometers in the case of an MEMS component.

Next, withdrawal of certain portions of the layer 101 is carried out so as to release the bar 104 from its support.

Figure 1B:
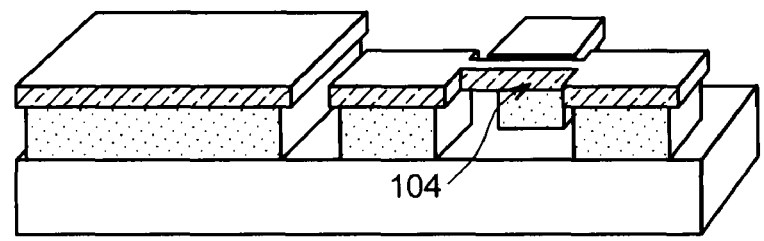

This partial withdrawal of the insulating layer 101 may be carried out by etching, for example with HF, so as to retain the blocks of the insulating layer 101 under the areas 102a, 102b, 102d, 102e of the thin semiconducting layer 102, respectively. The structure 102c, which in this example is in the form of a bar 104, is, as for it, released from the insulating layer 101 (FIG. 1B).

Next, after this first step for releasing the structure, passivation of the semiconducting bar 104 is carried out. For this, an insulating layer 107, notably covering this semiconducting bar 104, is formed. This insulating layer 107 is formed so as to surround the bar and may be made for example by oxidation of the semiconducting material of the thin semiconducting layer 102, and in particular of the semiconducting bar 104. A <<thermal>> oxide or oxide formed at high temperature may be made.

Figure 1C:
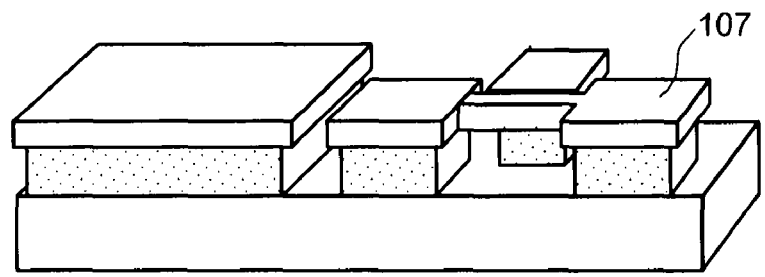

According to another possibility, the passivation insulating layer 107 may be made for example by depositing a dielectric material, such as for example $Si_xN_y$ (FIG. 1C).

Figure 1D:
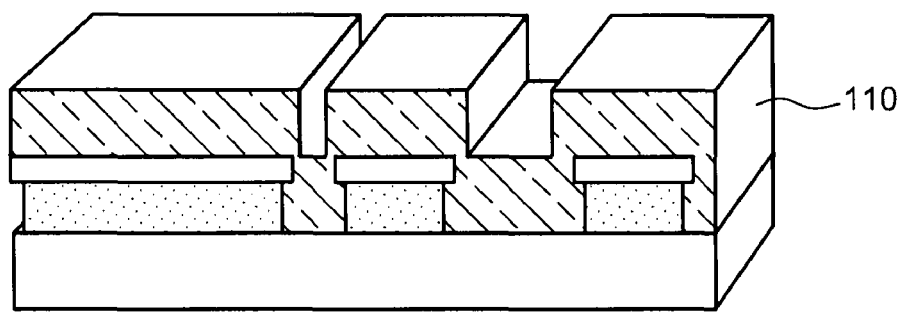

Next, an encapsulation layer 110 is formed, so as to surround the semiconducting bar 104. The encapsulation layer 110 may be made so as to cover the patterns 102a, 102b, 102c, 102d, 102e, and to fill certain portions of the layer 101 which have been withdrawn (FIG. 1D).

The encapsulation layer 110 is based on a material selected so that it may be selectively etched with regard to the material of the passivation layer 107.

The encapsulation layer 110 may be based on a semiconducting material, for example based on polySi or on amorphous Si.

Next, chemical-mechanical polishing (CMP) of the encapsulation layer 110 may be carried out, so as to make the surface of the latter planar.

Figure 1E:
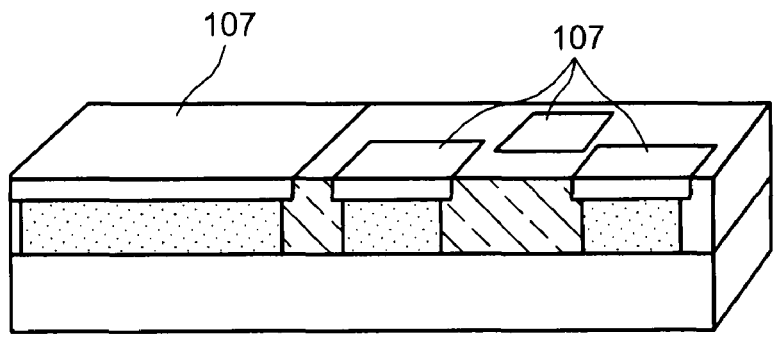

Next, withdrawal of the encapsulation layer 110 is carried out so as to reveal the passivation layer 107 above the patterns 102a, 102b, 102e, 102d (FIG. 1E).

This withdrawal may be for example carried out by dry etching of the encapsulation layer 110, selective with regard to the material of the passivation layer 107.

Etching of the revealed areas of the passivation layer 107 during the partial withdrawal of the encapsulation layer 110 carried out beforehand may then be performed. This withdrawal may be achieved by deoxidation of the passivation layer, for example by carrying out photolithography beforehand so as to define a mask (not shown) and then by performing selective etching of the passivation layer 107 through this mask, for example by means of wet HF-based etching.

Figure 1F:
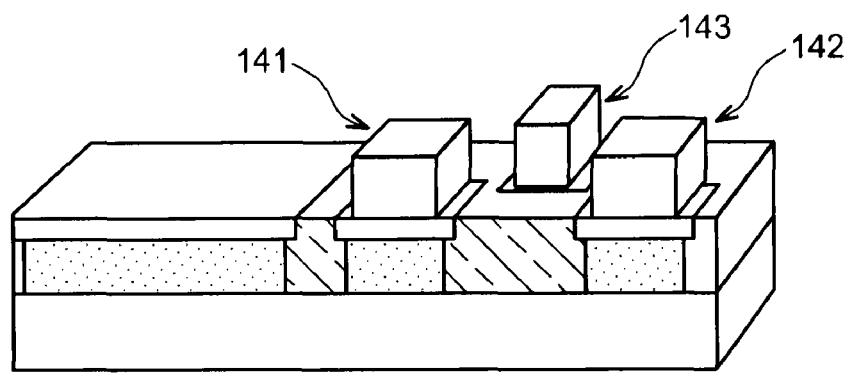

Next, pads 141, 142, 143 based on a conducting material are formed on the patterns 102b, 102d, 102e, respectively, so as to make contacts of the MEMS/NEMS component (FIG. 1F). This for example may be achieved by depositing a metal material such as for example aluminum, and then by etching this metal material.

The encapsulation layer 110 is then withdrawn, by selective etching with regard to the passivation layer 107 and to the contact pads 141, 142, 143.

Figure 1G:
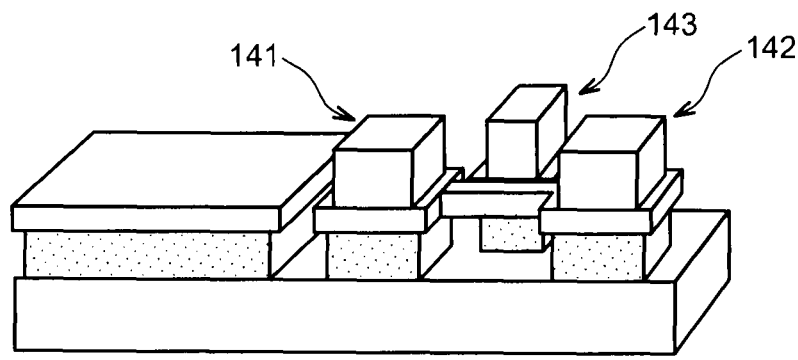

By withdrawing the encapsulation layer 110 around the bar 104, the latter may again be released. Selective etching may be carried out for example with $XeF_2$ gas (FIG. 1G).

As compared with the exemplary method which has just been given, it is also possible to form a transistor from the pattern 102a, before making the contact pads 141, 142, 143.

Figure 2A:
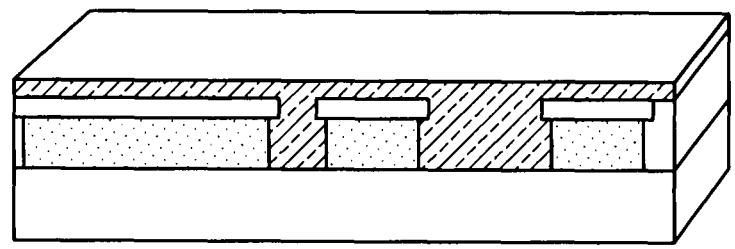
FIGS. 2A-2F illustrate an exemplary method for making a microelectronic device provided with a component including a mobile and/or detection semiconducting suspended structure surrounded by a passivation layer, co-integrated with a transistor formed from the same semiconducting layer as the vibrating structure.
Figure 2B:
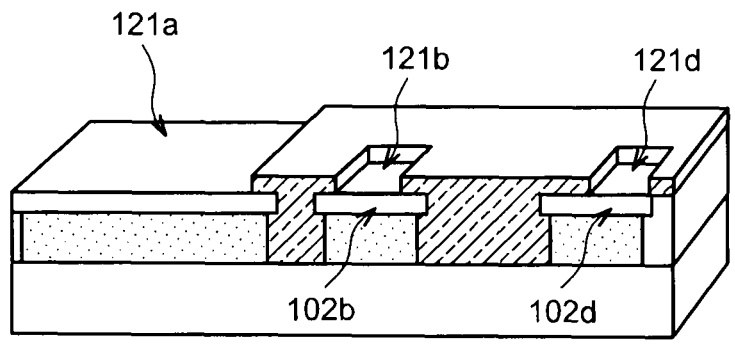

After a step for polishing the encapsulation layer 110 (FIG. 2A), in the encapsulation layer 110, apertures 121b, 121d may be made revealing patterns 102b, 102d of the electromechanical component, and an aperture 121a revealing the pattern 102a of an active area (FIG. 2B).

Figure 2C:
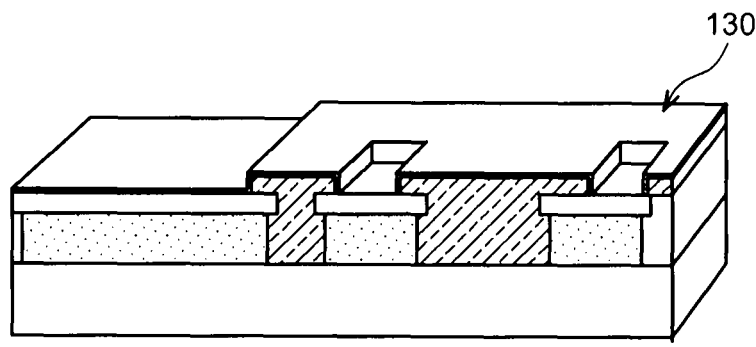

Next, a layer 130 for protecting the encapsulation layer 110 is formed, for example of HTO (High Thermal Oxide) silicon oxide (FIG. 2C). Generally, this protective layer 130 may consist of oxide or of any other material with which a role of stopping the etching of the encapsulation layer 110 may be played.

Figure 2D:
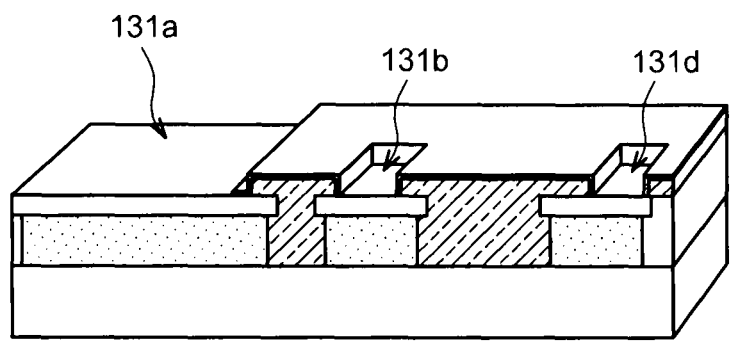

And then, opposite to the pattern 102a of the active area and the patterns 102b, 102d of electrodes of the electromechanical component, this protective layer 130 as well as the passivation layer 107 is withdrawn. This withdrawal may be carried out for example with a photolithography and wet HF-based etching step. Apertures 131a, 131b, 131d respectively revealing the patterns 102a, 102b, and 102d of the thin semiconducting layer 102 are thereby made (FIG. 2D). This partial etching of the protective layer 130 therefore allows access to the semiconducting area which will subsequently be used for making a transistor (at the aperture 131a), as well as to the areas which will allow an electric contact to be resumed on the different electrodes of the component (at the apertures 131b and 131d).

This protective layer 130 notably from a method point of view, allows insulation of the area on which the electric contact of the encapsulation layer 110 is made (corresponding to the patterns 102b and 102d in the example described here), which for example is based on polysilicon. Thus, it is possible to avoid any incompatibility of one or more materials which form the contact (for example: NiSi, Ti, TiN, W, etc.) with elements used for the etching of the encapsulation layer 110 (example of the $XeF_2$, $CF_4$ type, etc.), thereby avoiding any deterioration of the electric operation of the component with a suspended structure.

Next, a transistor T is formed from the pattern 102a.

Figure 2E:
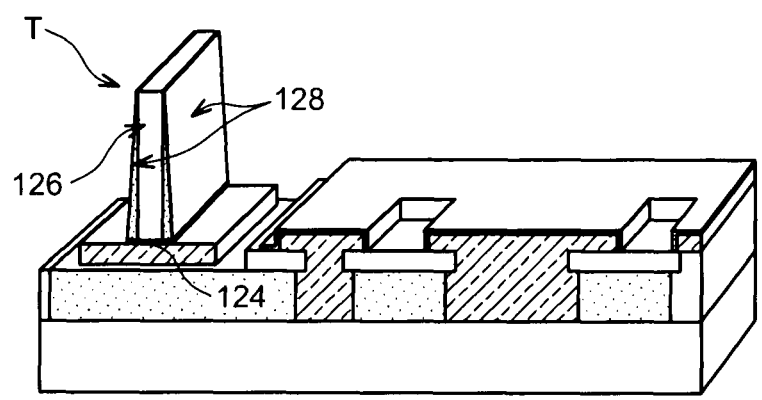

Steps for etching the pattern 102a, for doping the latter, for forming a gate dielectric area 124, for forming a gate 126, for forming spacers 128 on either side of this gate 126, may be carried out (FIG. 2E).

Figure 2F:
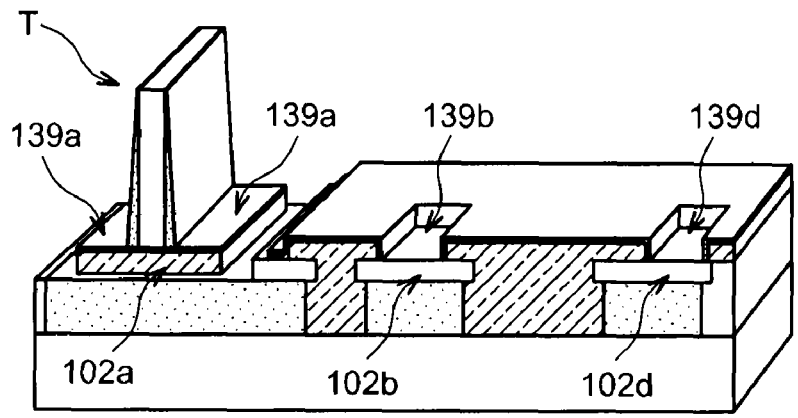

Silicided contact areas 139a, 139b, 139d may then be respectively formed on the patterns 102a, 102b, 102d, through the apertures 131a, 131b, 131d, by silicidation of the areas of the thin semiconducting layer 102 which are revealed (FIG. 2F).

Next, once the commonly called <<front-end>> steps are performed, the so-called <<back-end>> steps are performed during which one or more metal interconnection levels $M_1, \ldots, M_k$ are formed in a stack of several insulating layers $150_1, \ldots, 150_p$ above the transistor T and the electromechanical component C.

The stack of insulating layers $150_1, \ldots, 150_p$ may for example comprise TEOS layers of silicon oxide doped with phosphorus commonly called PSG (Phosphorus-doped Silicon Glass), of $SiH_4$ oxide.

Figure 3A:
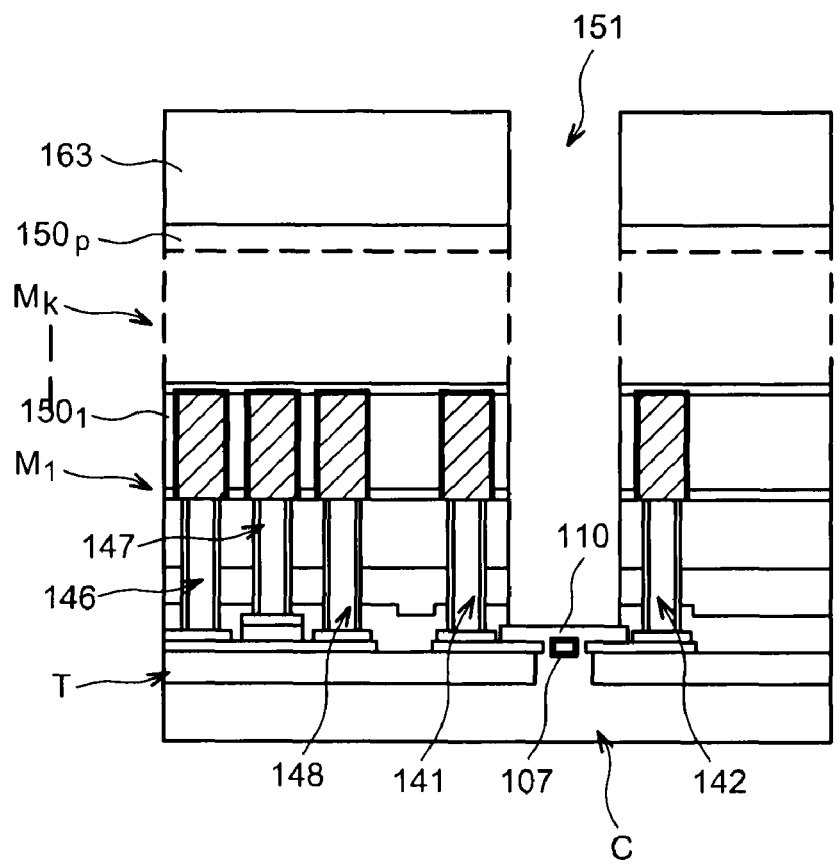
FIGS. 3A-3B, 4, 5A-5B illustrate an exemplary method for releasing a mobile structure of an electromechanical component formed with a semiconducting bar surrounded by a passivation layer.
Figure 3B:
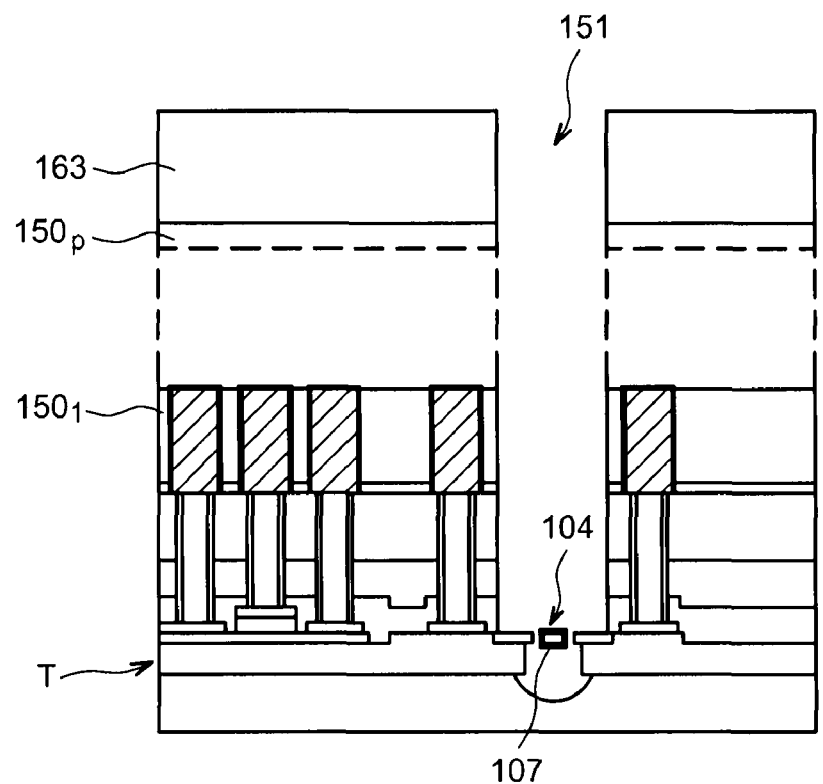
Figure 4:
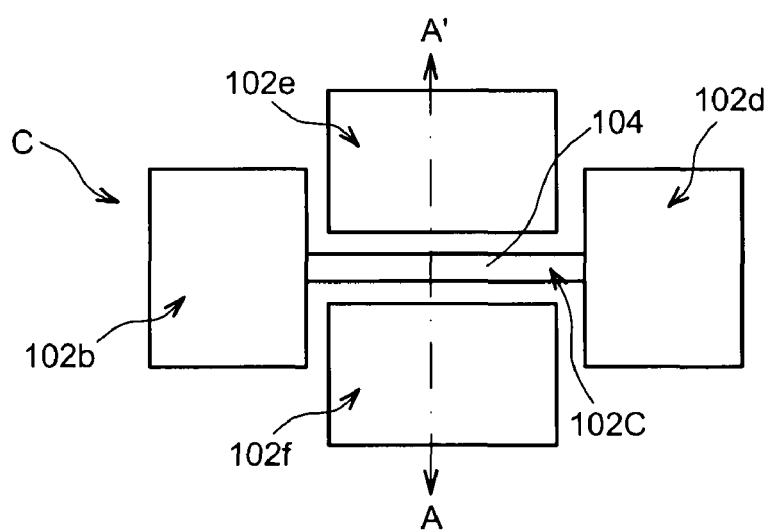

At least one hole 151 (FIGS. 3 A and 5A) is then formed revealing at least one portion of the electromechanical component C covered by the encapsulation layer 110 (the device during its making is illustrated in FIG. 3A, along a sectional view A'A indicated in FIG. 4, which illustrates the component C as seen from the top). This hole 151 may be formed by anisotropic dry etching through a mask 163, for example based on resin. If the protective layer 130 is based on oxide, it is possible that this protective layer 130 is automatically etched during the making of the hole 151, not interfering with the subsequent etching of the encapsulation layer. In the opposite case, a specific etching step for the protective layer 130 may be provided.

And withdrawal of the encapsulation layer 110 is then carried out through the hole 151 passing through the insulating layers $150_1, \ldots, 150_p$, so as to release the detection and/or actuation structure 102c of the electromechanical MEMS or NEMS component C. The encapsulation layer 110 around the bar 104 is thus withdrawn.

The encapsulation layer 110 which was used as a sacrificial layer may be withdrawn by selective etching with regard to the material of the passivation layer 107.

Etching may be achieved with $XeF_2$, notably in the case when the material of the encapsulation layer 110 is amorphous Si or polysilicon and when the passivation layer is based on silicon oxide.

Figure 5A:
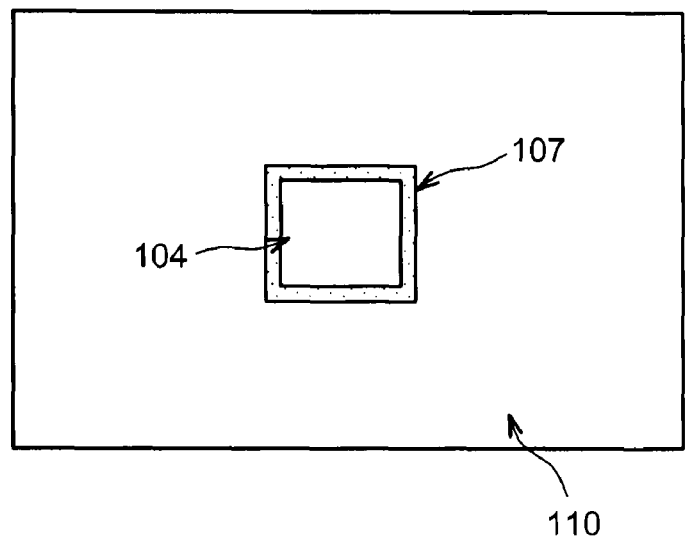
Figure 5B:
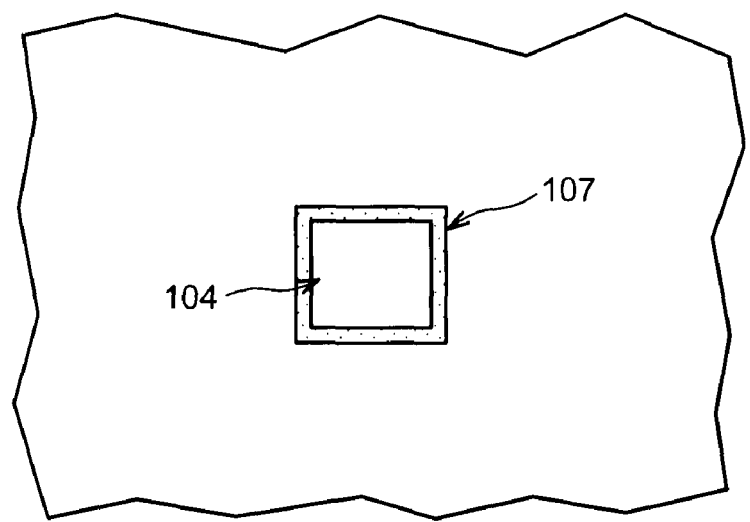

At the end of this release step of the semiconducting bar 104, the latter may be maintained suspended above the substrate via one or more blocks formed in the thin semiconducting layer 102. The semiconducting bar 104 may be surrounded by the dielectric material of the passivation layer 107 (FIGS. 3B and 5B).

The semiconducting bar 104 was thus released by etching the encapsulation layer 110 which is based on a material different from that of the insulating layers $150_1, \ldots, 150_p$ and from the one of the supporting insulating layer 101. Selective etching of the material of the encapsulation layer 110 with regard to the layers $150_1, \ldots, 150_p$, and 101 based on a dielectric material allows the release of the semiconducting bar 104, without altering these layers or creating possible harmful residues of dielectric material.

The passivation layer 107 may then be preserved.

By this for example a stable electric resistance of the semiconducting bar 104 may be preserved.

In the case when the passivation layer is formed with a thermal oxide with a low thermal expansion coefficient, with this passivation layer it is possible to decrease or cancel out the thermal coefficient of the structure.

With a passivation layer 107 retained around the bar 104, it is for example possible to allow formation of a resonator consisting of a semiconducting bar, for example based on Si surrounded by a dielectric, for example $SiO_2$. With such a layout, it is possible to obtain better stability of the resonance frequency with temperature.

According to an alternative of either one of the exemplary methods which have been described, the suspended structure which, in the examples given earlier, is in the form of a bar, may be made after its anchoring block or its anchoring blocks.

In this case, the anchoring blocks may for example be made in the semiconducting layer 102, while the element 104 may be formed by deposition and etching in another layer, for example a layer of PolySi or PolySiGe or by growing a nanotube or nanowire from one block or several anchoring blocks;

According to another embodiment possibility, the suspended structure applied with the method described here may be in the form of a beam or a suspended bar forming a suspended transistor channel for example of a transistor of the VbFET type.

Figure 6A:
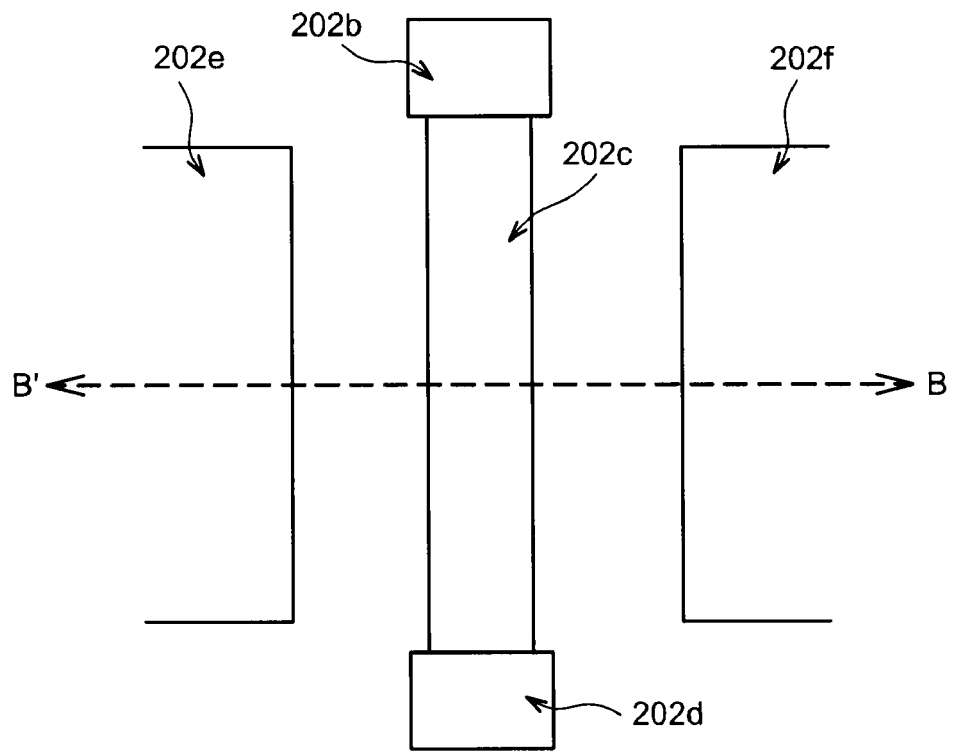
FIGS. 6A-6B illustrate an exemplary component which may be obtained with a method and which is provided with a semiconducting suspended structure formed with a semiconducting bar connecting a source area and a drain area and located between two gates.
Figure 6B:
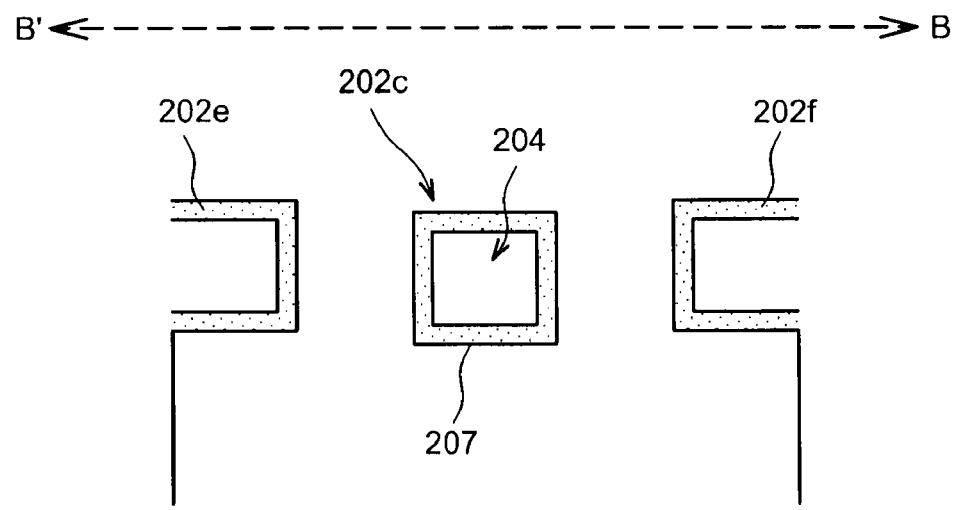

In FIGS. 6A-6B, an exemplary transistor is illustrated with a suspended channel structure 202c, applied with a method as described earlier, and bound to source blocks 202b and drain blocks 202d forming anchorings. Gates 202e, 202f are located on either side of the suspended structure 202c, which is in the form of semiconducting bar 204 surrounded by an insulating passivation layer 207, being used as a gate dielectric (the device being illustrated according to a top view in FIG. 6A and according to a cross-sectional view in FIG. 6B).

The invention claimed is:

1. A method for making a microelectronic device comprising at least one electromechanical or electronic component provided with a suspended structure, the method comprising, in this order, the steps a), b), c), and d) of:
    a) forming on a supporting layer, at least one element bound to at least one anchoring block in at least one thin layer positioned on the supporting layer, said element being intended to form said suspended structure of the electromechanical or electronic component,
    b) removing a portion of the supporting layer at least under said element, so as to release the suspended structure,
    c) forming a passivation layer around said element so as to completely encompass said element,
    d) forming an encapsulation layer covering said passivation layer and said element, the encapsulation layer being based on a material capable of being selectively etched with regard to the material of the passivation layer,
    the passivation and encapsulation layers being formed so as to cover the thin layer, and the method further comprising after step d), steps of:
        removing portions of the encapsulation layer, so as to reveal a given area of said thin layer,
        forming a protective layer of the encapsulation layer,
        partially removing the protection layer and the passivation layer so as to reveal at least said given area of said thin layer,
        forming at least one transistor from said given area of said thin area,
        making contact and/or interconnection conducting areas, and then
        suppressing the encapsulation layer around said element selectively with regard to the passivation layer, again releasing said suspended structure.

2. The method according to claim 1, wherein the element is semiconducting, the passivation layer being formed by oxidation of the semiconducting element.

3. The method according to claim 1, the passivation layer being formed by depositing a dielectric material around the suspended element.

4. The method according to claim 1, the encapsulation layer and the supporting layer being based on different materials.

5. The method according to claim 1, wherein the encapsulation layer is based on polysilicon or amorphous silicon or SiGe or Si.

6. The method according to claim 5, wherein the passivation layer is based on $SiO_2$ or $Si_xN_y$.

7. The method according to claim 1, wherein said removal of portions of the encapsulation layer comprises the formation of one or more apertures respectively above one or more anchoring blocks of said element, said removal of the protection layer and of the passivation layer being carried out so as to reveal said anchoring blocks, the method further comprising the formation of contacts on said anchoring blocks.

8. The method according to claim 7, wherein during the formation of contacts on said anchoring blocks, a plurality of contacts of the transistor is made.

9. The method according to claim 1, wherein said thin layer and the supporting layer are layers of a semiconductor-on-insulator substrate such as an SOI substrate, the thin layer being semiconducting and the supporting layer being insulating.

10. The method according to claim 1, wherein said embodiment of conducting areas comprises the formation of a stack of one or more metal levels for interconnecting components of the microelectronic device and of one or more insulating layers, said stack covering said electromechanical component, the method further comprising:

formation of a hole in said stack facing the element and revealing the encapsulation layer, said suppression of the encapsulation layer around said element being carried out by etching the encapsulation layer through said hole.

11. The method according to claim 1, said suppression of the encapsulation layer around said element being carried out by etching with $XeF_2$.

* * * * *